United States Patent [19]
Yabu et al.

[11] Patent Number: 5,128,274
[45] Date of Patent: Jul. 7, 1992

[54] METHOD FOR PRODUCING A SEMICONDUCTOR DEVICE HAVING A LOCOS INSULATING FILM WITH AT LEAST TWO DIFFERENT THICKNESS

[75] Inventors: Toshiki Yabu, Hirakata; Masanori Fukumoto, Osaka; Yasushi Naito, Toyonaka, all of Japan

[73] Assignee: Matsushita Electric Industrial Co., Ltd., Osaka, Japan

[21] Appl. No.: 721,186

[22] Filed: Jun. 26, 1991

Related U.S. Application Data

[62] Division of Ser. No. 559,620, Jul. 30, 1990, abandoned.

[30] Foreign Application Priority Data

Aug. 1, 1989 [JP] Japan ............... 1-200586

[51] Int. Cl.⁵ ........................... H01L 21/76
[52] U.S. Cl. ...................... 437/70; 437/62; 437/69; 437/61; 437/52
[58] Field of Search ............ 437/62, 70, 69, 61

[56] References Cited

U.S. PATENT DOCUMENTS

| | | | |
|---|---|---|---|
| 4,170,492 | 10/1979 | Bartlett et al. | 437/70 |
| 4,258,466 | 3/1981 | Kuo et al. | 437/70 |
| 4,288,910 | 9/1981 | Heeren | 437/69 |
| 4,466,174 | 8/1984 | Darley et al. | 437/70 |
| 4,520,553 | 6/1985 | Kraft | 437/69 |

FOREIGN PATENT DOCUMENTS

| | | | |
|---|---|---|---|
| 0107851 | 5/1984 | European Pat. Off. | 437/70 |
| 0027543 | 2/1984 | Japan | 437/70 |

*Primary Examiner*—Brian E. Hearn
*Assistant Examiner*—Trung Dang
*Attorney, Agent, or Firm*—Ratner & Prestia

[57] ABSTRACT

There are provided semiconductor devices including a semiconductor substrate having a surface divided into a first and second regions, a plurality of active regions formed on the substrate, and a local-oxidized (LOCOS) insulating film formed on the substrate as an isolation region for electrical isolation of the active regions from each other. The LOCOS insulating film is thicker in the first region than in the second region, or the LOCOS insulating film has a difference in level based on the thickness change in the vicinity of the boundary between the first and second regions. Also provided are various methods for producing such semiconductor devices.

1 Claim, 20 Drawing Sheets

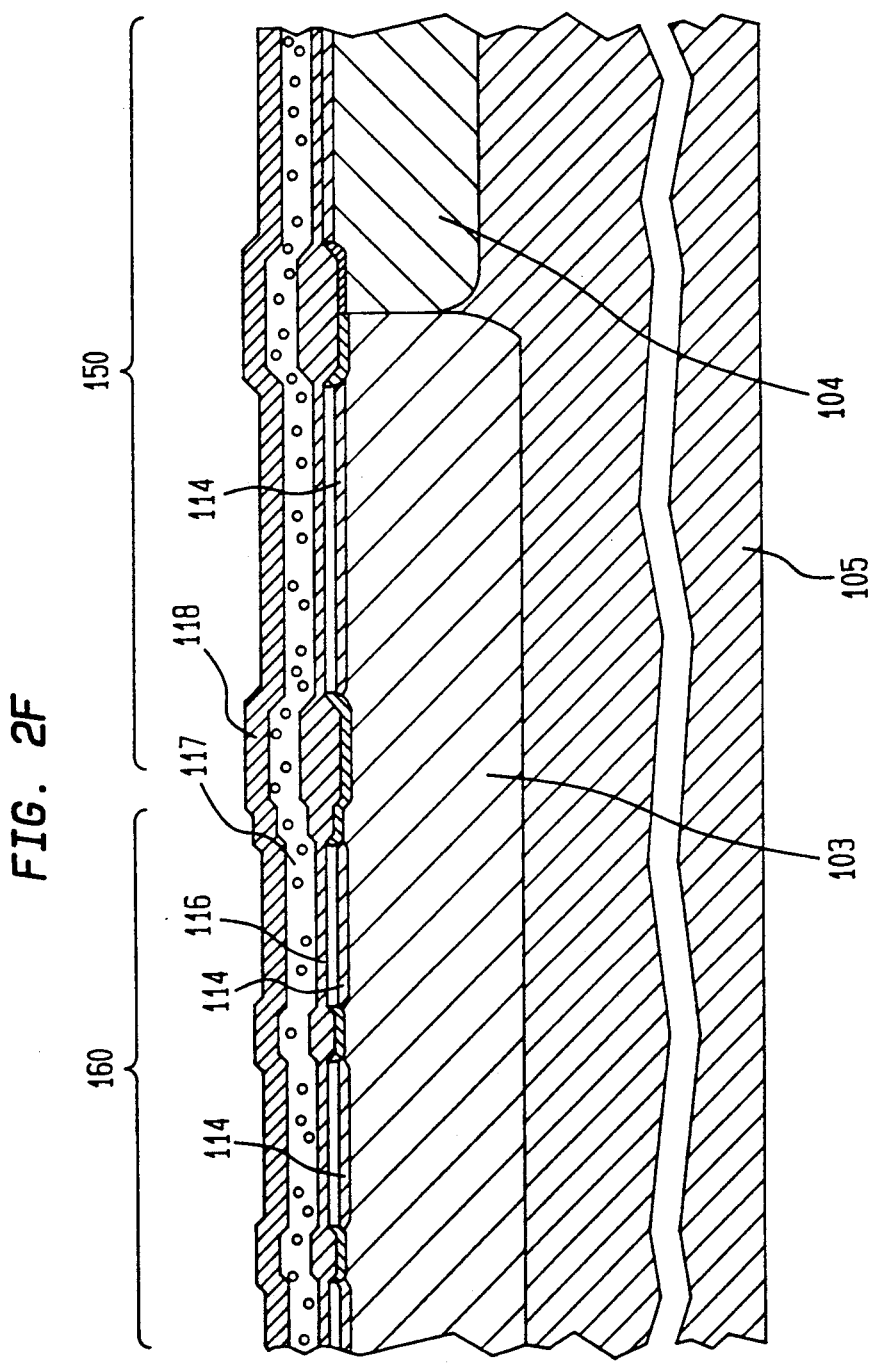

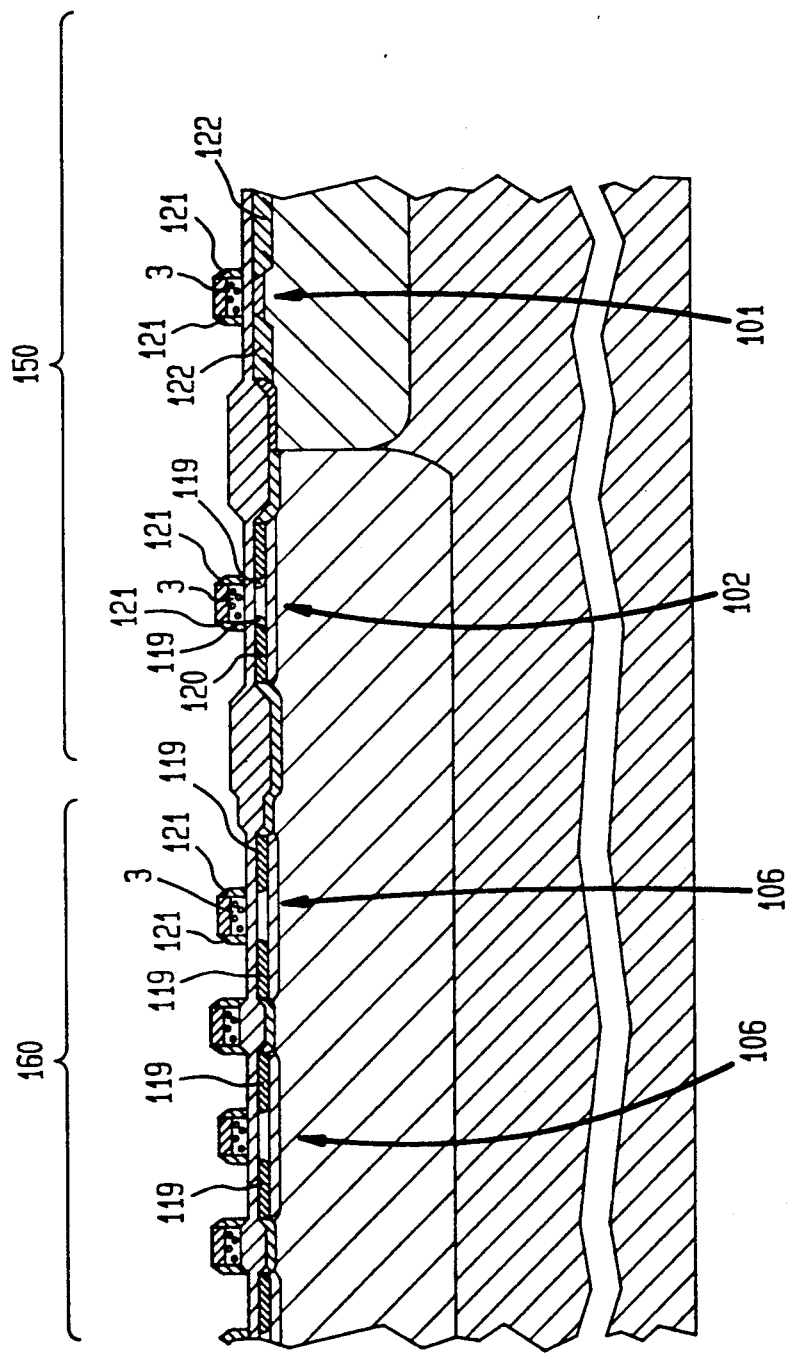

FIG. II
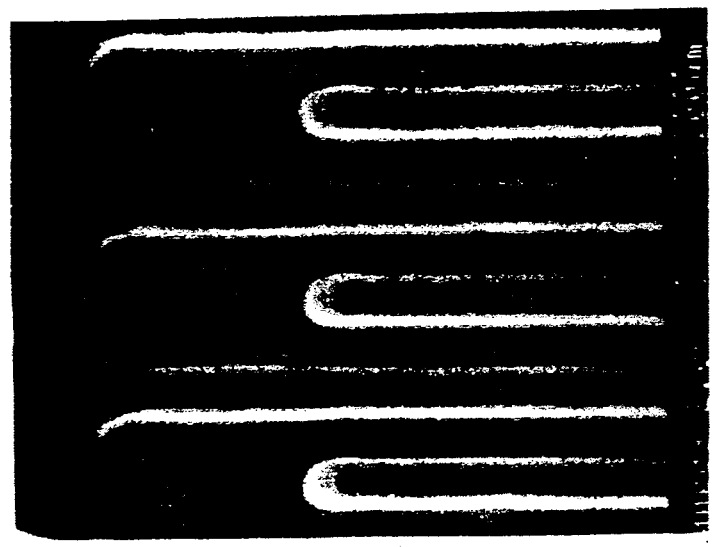

1

METHOD FOR PRODUCING A SEMICONDUCTOR DEVICE HAVING A LOCOS INSULATING FILM WITH AT LEAST TWO DIFFERENT THICKNESS

This application is a division, of application Ser. No. 07/559,620, filed Jul. 30, 1990.

BACKGROUND OF THE INVENTION

1. Field of the Invention

This invention relates to a semiconductor device and more particularly to a semiconductor device in which elements are isolated by a local-oxidized (LOCOS) insulating film. This invention also relates to a method for producing the semiconductor device.

2. Description of the Prior Art

Semiconductor devices in which transistors and other elements are formed on one semiconductor substrate generally have a plurality of active regions on which these elements are formed and an isolation region surrounding the active regions on the semiconductor substrate.

Local oxidation (LOCOS) is widely used as an element isolation technology because of its easy production and low production cost.

To simplify the explanation in this specification, insulating films formed by a LOCOS method are referred to as LOCOS insulating films and the oxidation for forming the LOCOS insulating film is referred to as the LOCOS process.

Below is an explanation of the prior art, referring to FIGS. 7A and 7B.

First, an oxide film 62 (50 nm thick) as a protective film and a CVD-$Si_3N_4$ film 63 (120 nm thick) as a mask layer are successively grown on a silicon substrate 61, and then a resist 64 is formed on the CVD-$Si_3N_4$ film 63 in a pattern which defines the isolation regions on the silicon substrate 61. The resist 64 has openings over the isolation regions on the silicon substrate 61. The CVD-$Si_3N_4$ film 63 under these openings is removed by anisotropic etching (see FIG. 7A).

After the resist 64 is removed, the silicon substrate 61 is selectively oxidized in the regions where the CVD-$Si_3N_4$ film 63 is removed (see FIG. 7B). In this manner, the LOCOS insulating film 65 is formed in the isolation regions of the silicon substrate 61. The CVD-$Si_3N_4$ film 63 in the regions (active regions) where the LOCOS insulating film 65 was not grown on the silicon substrate 61 is removed in a later step, and transistors and other elements are formed in these active regions.

The above prior art technology presents the following problems.

As shown in FIG. 7B, the LOCOS insulating film 65 grows horizontally as well as vertically during the LOCOS process. This horizontal growth can cause the LOCOS insulating film 65 to penetrate under the CVD-$Si_3N_4$ film 63. This penetrating part of the LOCOS insulating film 65 is referred to as "bird's beak," and the length of horizontal penetration (bird's beak length) increases as the LOCOS insulting film 65 is made thicker.

Due to this bird's beak, the actual LOCOS insulating film 65 are wider than the designed isolation region, and the actual active regions narrower than the designed active regions.

As the number of active regions increases and their widths become smaller with increased levels of integration, the reduced effective area of active regions due to bird's beak becomes a problem. Particularly when bird's beak becomes longer than half the width of the active regions, the active regions become entirely covered by bird's beak and elements can no longer be formed on those active regions. Even if the active regions are not entirely covered by bird's beak, if they become too small, the characteristics of the MOS field-effect transistors (MOSFET) formed on those active regions is subject to the narrow channel effect.

To prevent this kind of problem, the thickness of the LOCOS insulating film can be reduced to shorten the length of bird's beak, but if the LOCOS insulating film is too thin, the serious problem of insufficient element isolation results.

As described above, when the LOCOS insulting film is made thin to inhibit the penetration of bird's beak in the prior art, the element isolation characteristic is degraded, and if the LOCOS insulting film is made thicker to improve the element isolation characteristics, the MOSFET formed on the small active regions are subject to the narrow channel effect.

SUMMARY OF THE INVENTION

The semiconductor device of this invention, which overcomes the above-discussed and numerous other disadvantages and deficiencies of the prior art, comprises a semiconductor substrate having a surface divided into a first and second regions, a plurality of active regions formed on the substrate, and a localoxidized (LOCOS) insulating film formed on the substrate as an isolation region for electrical isolation of the active regions from each other, wherein the LOCOS insulating film is thicker in the first region than in the second region, or wherein the LOCOS insulating film has a difference in level based on the thickness change in the vicinity of the boundary between the first and second regions.

In a preferred embodiment, the active regions are wider in the first region than in the second region.

In a more preferred embodiment, the first region is provided with a peripheral circuit section and the second region is provided with a memory cell section.

In a still more preferred embodiment, the semiconductor substrate has an impurity diffusion region below the LOCOS insulating film, the impurity concentration being lower in the first region than in the second region.

The method for producing a semiconductor device of this invention, which overcomes the above-discussed and numerous other disadvantages and deficiencies of the prior art, is used for semiconductor devices in which a plurality of active regions formed on a semiconductor substrate having a surface divided into a first and second regions are electrically isolated from each other by a LOCOS insulating film formed on the substrate.

The first method of this invention comprises the steps of: selectively oxidizing a prescribed portion of the first region in the surface of the semiconductor substrate by a first LOCOS process; and selectively oxidizing a prescribed portion of the second region and the prescribed portion of the first region in the surface of the semiconductor substrate by a second LOCOS process so that the LOCOS insulating film is made thicker in the first region than in the second region.

The second method of this invention comprises the steps of: selectively oxidizing a prescribed portion of the first region in the surface of the semiconductor substrate by a first LOCOS process; and selectively oxidizing a prescribed portion of the second region in the surface of the semiconductor substrate by a second LOCOS process so that the LOCOS insulating film is made thicker in the first region than in the second region.

The third method of this invention comprises the steps of: forming a masking film on the substrate; patterning the masking film to have openings on the areas where the LOCOS insulating film is to be formed in the first region of the substrate; forming an oxide film on the surface of the substrate in the openings where the substrate is exposed; further patterning the masking film to have other openings on the areas where the LOCOS insulating film is to be formed in the second region of the substrate; and forming a relatively thin portion of the LOCOS insulating film by an oxidation process, on the surface of the substrate in the other openings where the substrate is exposed, and simultaneously further growing the oxide film in the first region to form a relatively thick portion of the LOCOS insulating film.

The fourth method of this invention comprise the steps of: forming a first masking film on the substrate; patterning the first masking film to have openings on the areas where the LOCOS insulating film is to be formed in the first region of the substrate; forming a relatively thick portion of the LOCOS insulating film on the surface of the substrate in the openings where the substrate is exposed; removing the first masking film; forming a second masking film on the substrate; patterning the second masking film to have openings on the areas where the LOCOS insulating film is to be formed in the second region of the substrate; and forming a relatively thin portion of the LOCOS insulating film by an oxidation process on the surface of the substrate in the openings where the substrate is exposed.

The fifth method of this invention comprises the steps of: forming a masking film on the substrate; growing an oxide film on the masking film; removing the portion of the oxide film positioned above the first region; forming a resist having openings on the areas where the active regions are to be formed in the substrate, on the oxide film and masking film; patterning the oxide film and masking film by the use of the resist as a mask, so that the masking film has openings on the areas where the LOCOS insulating film is to be formed in the first region of the substrate, resulting in a thin portion of the oxide film where the LOCOS insulating film is to be formed in the second region of the substrate; forming an oxide film, after removing the resist, on the surface of the substrate in the openings where the substrate is exposed; removing a thin portion of the oxide film and further removing a portion of the masking film below the thin portion of the oxide film, and then forming openings in the masking film; and forming a relatively thin portion of the LOCOS insulating film by an oxidation process, in the second region of the substrate in the openings where the substrate is exposed, and simultaneously further growing the oxide film in the first region to form a relatively thick portion of the LOCOS insulating film.

Thus, the invention described herein makes possible the objectives of (1) providing a semiconductor device in which the characteristics of elements formed in a relatively narrow active region having a bird's beak of the LOCOS insulating film are not degraded, and also the element isolation characteristics are not degraded even though the elements formed in a relatively wide active region are allowed to operate with a high speed and high driving power; and (2) providing a method for the production of such a semiconductor device.

BRIEF DESCRIPTION OF THE DRAWINGS

This invention may be better understood and its numerous objects and advantages will become apparent to those skilled in the art by reference to the accompanying drawings as follows:

FIGS. 2A to 2I are sectional views showing the production of the semiconductor device of FIG. 1A.

FIG. 11 is an electron micrograph showing the active region surrounded by a thin LOCOS insulating film.

DESCRIPTION OF THE PREFERRED EMBODIMENTS

Figure 1A:
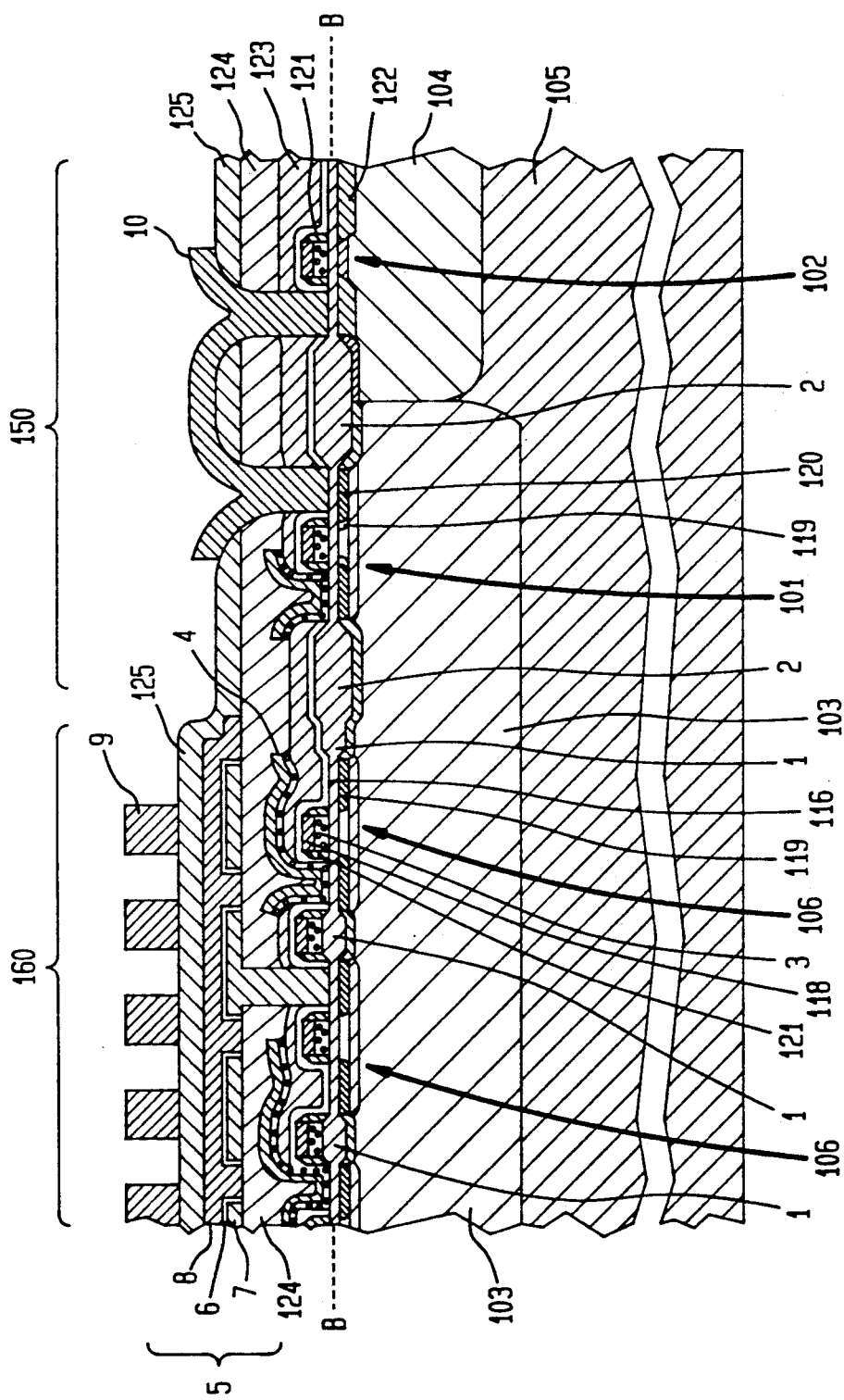
FIG. 1A is a sectional view showing the first embodiment of the semiconductor device of this invention.

FIG. 1A is a cross section showing the principal parts of the first embodiment of this invention. The first embodiment is a 16-megabit dynamic RAM (DRAM).

In general, 16-megabit DRAM are made up of a memory cell section with numerous active regions that have been reduced in width as much as production technology will allow, a peripheral circuit section with active regions larger in width than the active regions of the memory cell section and a silicon substrate (chip) on which both are formed.

The memory cell section of this embodiment is designed to be driven on 3.3 volts, and the peripheral circuit section is designed to be driven on 5.0 volts to maintain compatibility with prior art semiconductor devices. The reliability of the transistors of the memory cell section is improved by driving it on 3.3 volts. Also, a high driving power and fast operation are realized by driving the peripheral circuit section on 5.0 volts.

The first embodiment, as shown in FIG. 1A, comprises a memory cell section with n-type MOSFET 106 and capacitors, etc., connected to the n-type MOSFET 106, and a peripheral circuit section with n-type MOSFET 101, p-type MOSFET 102, etc., on one silicon substrate 105.

In this specification, the region where the peripheral circuit section is formed on the silicon substrate 105 is referred to as the first region, and the region where the memory cell section is formed is referred to as the second region.

Below is a more detailed explanation of the configuration of the first embodiment.

In the silicon substrate 105 are formed a p-well 103 and an n-well 104. The n-well 104 and part of the p-well 103 are located in first region 150 of the silicon substrate 105, and the remaining part of the p-well 103 is in the second region 160 of the silicon substrate 105.

The surface of the silicon substrate 105 is divided into a plurality of active regions where MOSFET and other elements are formed and an isolation region where the LOCOS insulating films 1 and 2 are formed. The LOCOS insulating films 1 and 2 are field oxide films which electrically isolate the active regions from each other.

Figure 1B:
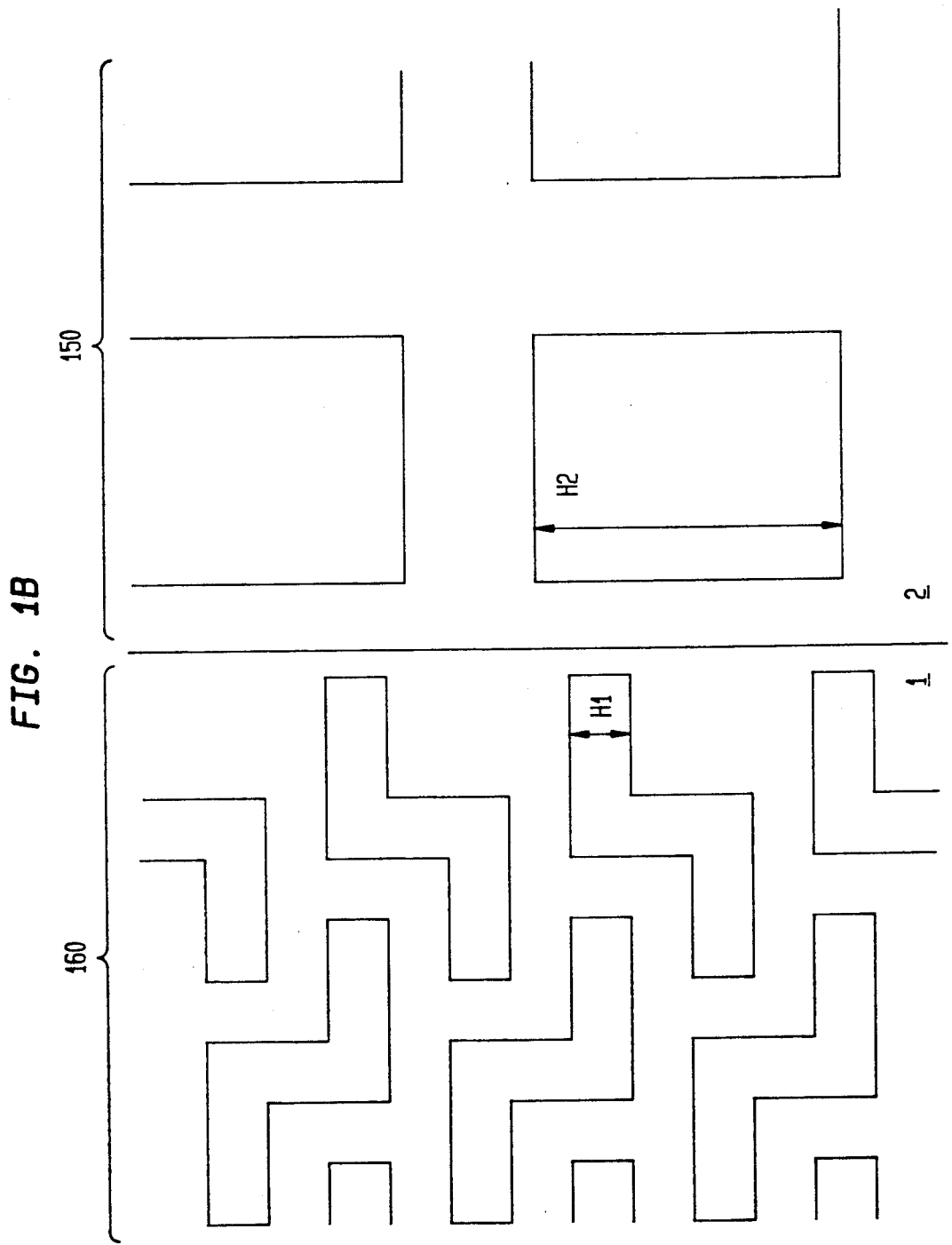
FIG. 1B is a plan view taken along line B—B of FIG. 1A.

FIG. 1B is a top cross section taken along line B-B in FIG. 1A, showing the planar shape of the above-mentioned active region and LOCOS insulating film.

As can be seen in FIG. 1B, the width of the active regions (indicated by H1 in this figure) in the second region 160 on the silicon substrate 105 where the memory cells, which require dense integration of elements, are formed is smaller than the width of the active regions (indicated by H2 in this figure) in the first region 150 where the peripheral circuit section is formed.

More specifically, the minimum width of the active regions in the second region 160 on the silicon substrate 105 is 0.7 $\mu$m, while the minimum width of the active regions in the first region 150 of the silicon substrate 105 is 2.0 $\mu$m.

The first structural feature of this embodiment is that the LOCOS insulating film is composed of the thin LOCOS insulating film 1 and the thick LOCOS insulating film 2. The second feature is that the thick LOCOS insulating film 2 is formed in the first region 150 of the silicon substrate 105 and the thin LOCOS insulating film 1 is formed in the second region 160. The third feature is that the width of the active regions in the first region 150 is wider than the width of the active regions in the second region 160.

The following explanation refers back to FIG. 1A. The n-type MOSFETs 101 and 106 are formed in the active region of the p-well 103, and the p-type MOSFET 102 is formed in the active region of the n-well 104.

The n-type MOSFETs 106 and 101 and the p-type MOSFET 102 each comprise the source/drain 119, 120 and 122 formed in the silicon substrate 105, the gate oxide film 116 formed on a prescribed part of the active region, the word lines 3 formed on the gate oxide film 116, the oxide film 118 formed on the word lines 3, and the side wall 121 formed on the sides of the word lines 3.

The source/drain 120, which has a higher concentration than the source/drain 119, is formed in the n-type MOSFET 101, and the source/drain 119 below the side wall 121 functions as the LDD of the n-type MOSFET 101.

The word lines of the MOSFETs 101, 102 and 106 run along the LOCOS insulating films 1 and 2, and the interlayer insulating film 123 is formed on the silicon substrate 105 so as to cover the MOSFETs 101, 102 and 106. The bit lines 4 are formed on top of the interlayer insulating film 123, and the interlayer insulating film 124 is formed on top of the interlayer insulating film 123 so as to cover the bit lines 4.

A charge storage capacitor 5 comprising a storage node 7, a capacitive oxide film 6 and a plate electrode 8 is formed on top of the interlayer insulating film 124, and the storage node 7 is electrically connected to the source/drain 119 of the MOSFET 106, which is the switching transistor, through a hole formed in the interlayer insulating films 123 and 124.

The interlayer insulating film 125 is formed on the interlayer insulating film 124 so as to cover the capacitor 5, and the metal wirings 9 and 10 are formed on top of the interlayer insulating film 125. The metal wiring 10 is connected to the MOSFETs 101 and 102 of the peripheral circuit through a contact hole formed in the insulating films 123, 124 and 125. The metal wiring 9 is connected to the word line of the MOSFET 106 in the memory cell section through a contact hole (not shown) in the insulating films 118, 123, 124 and 125.

The LOCOS insulating film of this embodiment comprises the thin LOCOS insulating film 1 and the thick LOCOS insulating film 2, so that the top and bottom surfaces of the LOCOS insulating film have a difference in height. The thick LOCOS insulating film 2 is formed in the first region 150 of the silicon substrate 105, and the thin LOCOS insulating film 1 is formed in the second region 160, so that the difference in height is at the border between the first region 150 and the second region 160.

Since the LOCOS insulating film 2 in the first region 150 of the silicon substrate 105 is thick, complete element isolation is achieved even when driven at 5 volts. The channel width of the active region in MOSFET will exhibit a large driving power, and therefore there is no narrow channel effect even though the LOCOS insulating film 2 is thick and the bird's beak is long.

The thickness of the LOCOS insulating film 1 in the second region 160 of the silicon substrate 105 is adjusted so that the length of bird's beak is not greater than approximately 0.1 $\mu$m. Therefore, an effective width of 0.5 $\mu$m for the active regions in the second region 160 is maintained, thus suppressing the narrow channel effect.

Since the memory cell section of this embodiment is driven at 3.3 volts, the reliability of the transistors in the memory cell section is improved, and though the LOCOS insulating film 1 is relatively thin, sufficient element isolation is achieved. Further, the peripheral circuit section is driven at 5.0 volts in order to realize a large driving power and high speed operation, but sufficient element isolation is achieved by the relatively thick LOCOS insulating film 2.

Moreover, since the charge storage capacitor 5 of this embodiment is of the stacked type, which is formed above the word lines 3 and the bit lines 4, a memory cell section with a high integration level is formed on the limited area of the second region 160 of the silicon substrate 105. Furthermore, the capacitive insulating film 6 is an ONO film, so that the storage capacity is increased.

Below, the method by which the DRAM shown in FIG. 1A was produced is explained referring to FIGS. 2A to 2I.

First, in the regions where the p-well 103 and n-well 104 were to be formed in the silicon substrate 105, boron and phosphorus ions were each selectively implanted by an ion implantation method. Boron ions were implanted at an acceleration energy of 120 keV and a dose of $4.0 \times 10^{12}$ ions/cm$^2$, and phosphorus ions were implanted at an acceleration energy of 120 keV and a dose of $1.0 \times 10^{13}$ ions/cm$^2$. Next, the silicon substrate 105 was subjected to heat treatment at 1100° C. for 960 minutes, whereby the p-well 103 and n-well 104 were formed in the silicon substrate 105.

An oxide film 12 (20 nm thick) was formed over the entire surface area of the silicon substrate 105 as a protective layer to protect the surface of the silicon substrate 105 from damage due to the LOCOS processes performed later. An Si$_3$N$_4$ film 13 (160 nm thick) was then formed over the entire surface of the oxide film 12 as a mask (i.e., making film) to prevent further oxidation.

Figure 2A:
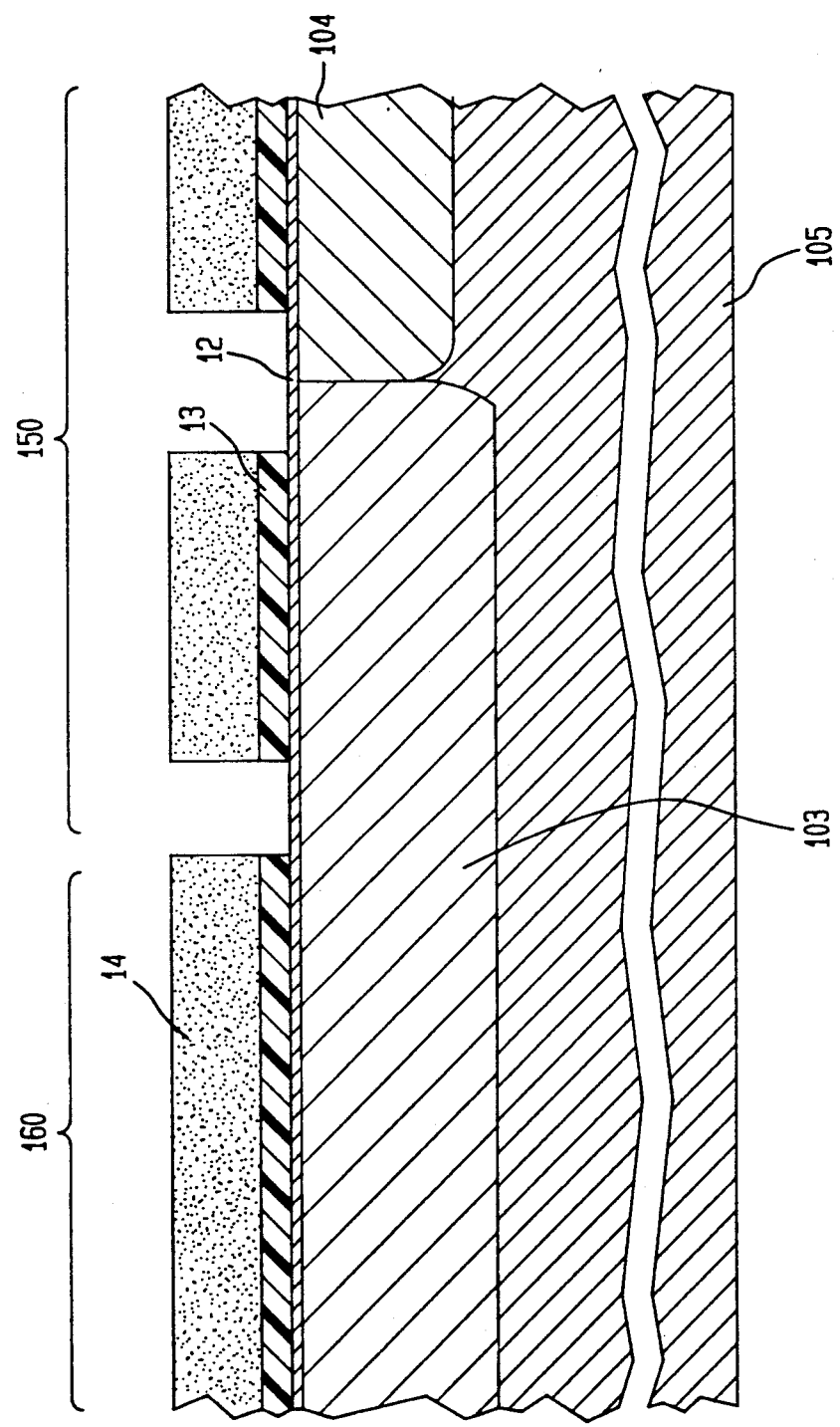
Figure 2B:
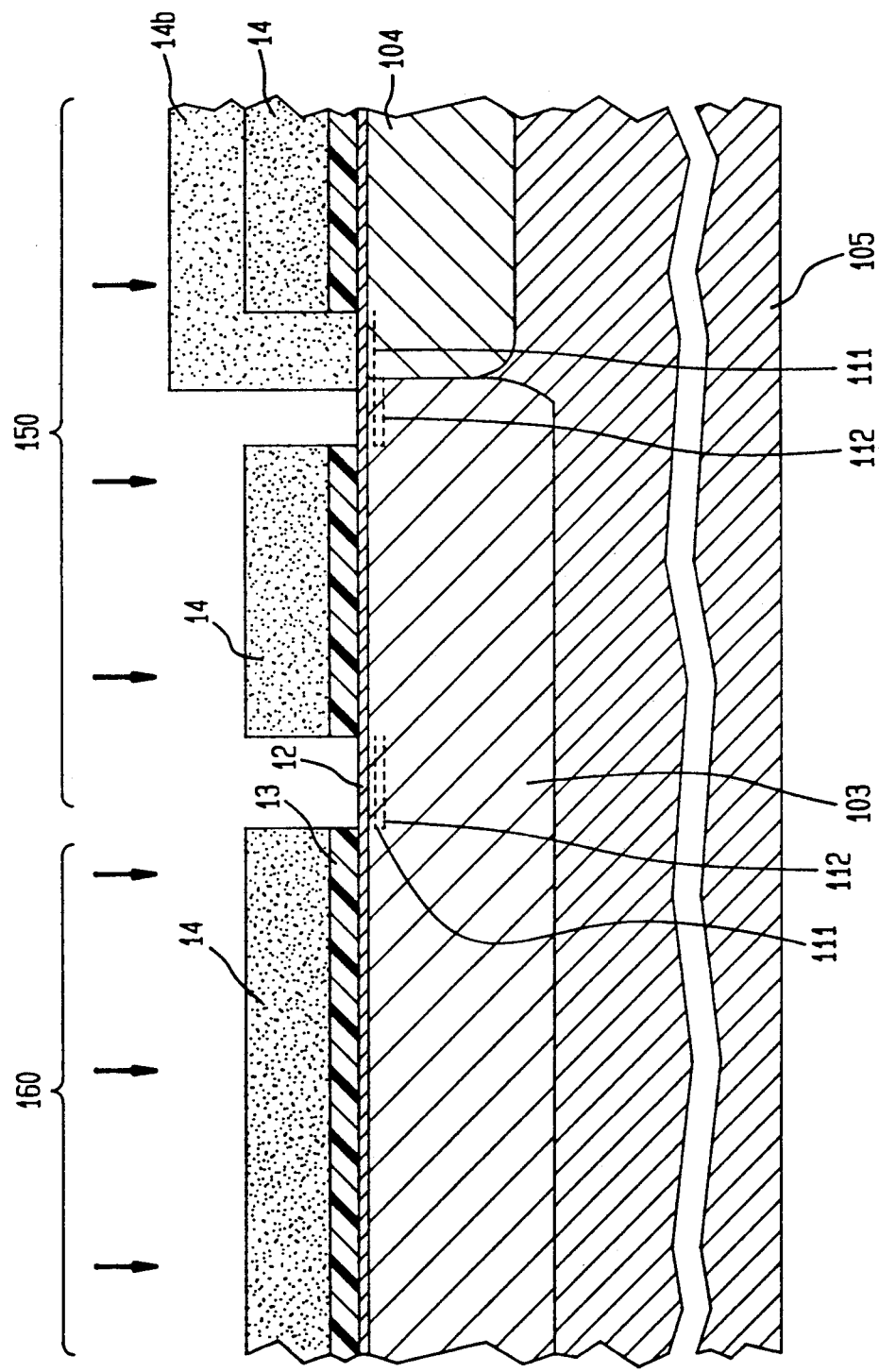

After a resist 14 with openings was formed on the Si$_3$N$_4$ film 13 in the regions where the thick LOCOS insulating film 2 was to be formed, the Si$_3$N$_4$ film 13 at the openings was removed by anisotropic etching (see FIG. 2A).

A resist 14 with openings over the regions where the channel stops 111 were to be formed was then formed on the silicon substrate 105 in order to form channel stops in the silicon substrate 105 in the isolation regions of the peripheral circuit section.

Thereafter, phosphorus ions were implanted in the silicon substrate 105 by an ion implantation method through the openings in the resist 14. Implantation was performed at an acceleration energy of 100 keV and a dose of $5.0 \times 10^{11}$ ions/cm$^2$. In this way, p-channel stops 111 were formed in the isolation regions surrounding the active regions where the p-type MOSFET 102 were to be formed.

Without removing the resist 14, the resist 14b was formed on the silicon substrate 105 so as to cover the region where the p-type MOSFET 102 were to be formed, and then boron ions were implanted in the silicon substrate 105 by an ion implantation method through the openings in the resists 14 and 14b. Implantation was performed at an acceleration energy of 80 keV and a dose of $1.5 \times 10^{13}$ ions/cm$^2$. Since the boron concentration was higher than that of the previously implanted phosphorus, n-channel stops 112 were formed in the isolation regions surrounding the active regions of the peripheral circuit section where n-type MOSFET were to be formed.

Figure 2C:
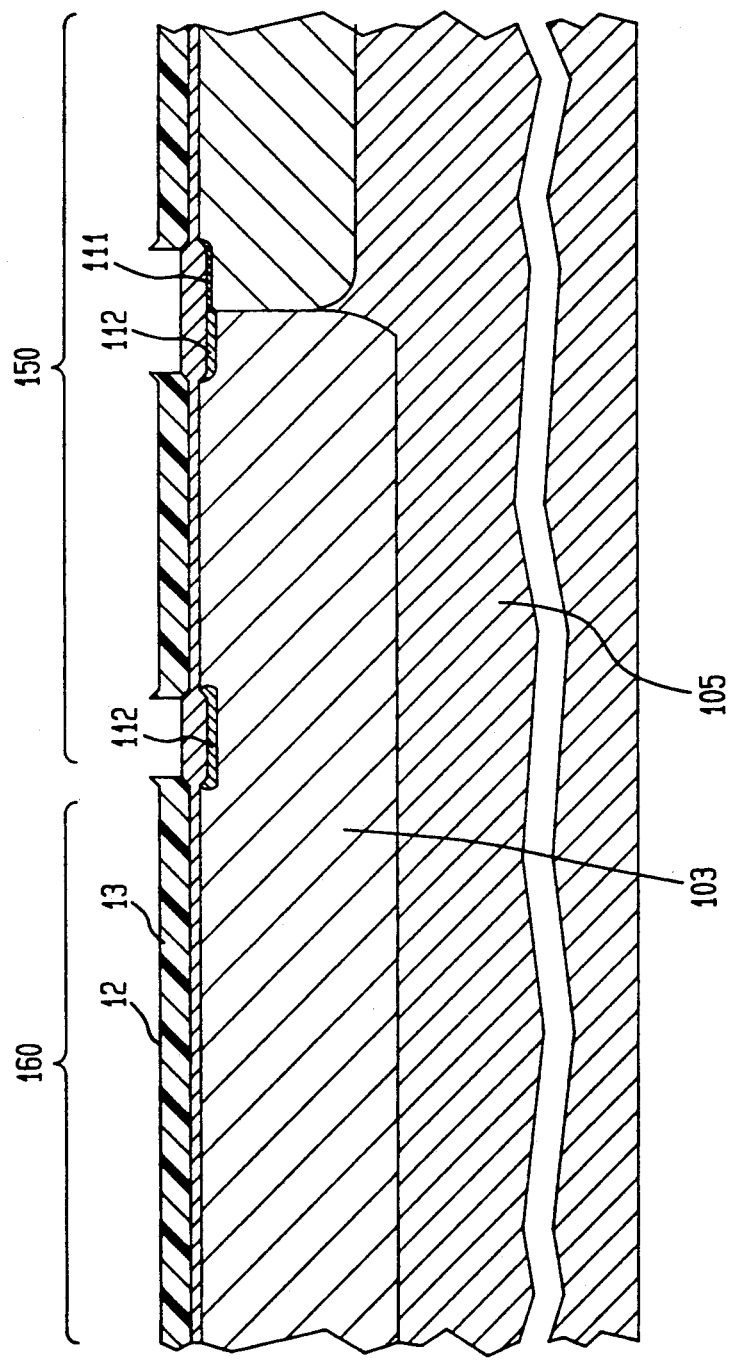

After the resists 14 and 14b were removed, the surface of the regions not covered with the Si$_3$N$_4$ film 13 in the silicon substrate 105 were selectively oxidized (first LOCOS process) (see FIG. 2C).

The second region 160 of the silicon substrate 105 was not oxidized by the first LOCOS process. The oxide film grown in the first region 150 was further grown to become the thicker LOCOS insulating film 2 by the second LOCOS process performed later.

After the resist 15 was formed on the silicon substrate 105 with openings in the regions where the thin LOCOS insulating film 1 was to be formed, the Si$_3$N$_4$ film 13 at the openings was removed by anisotropic etching.

Figure 2D:
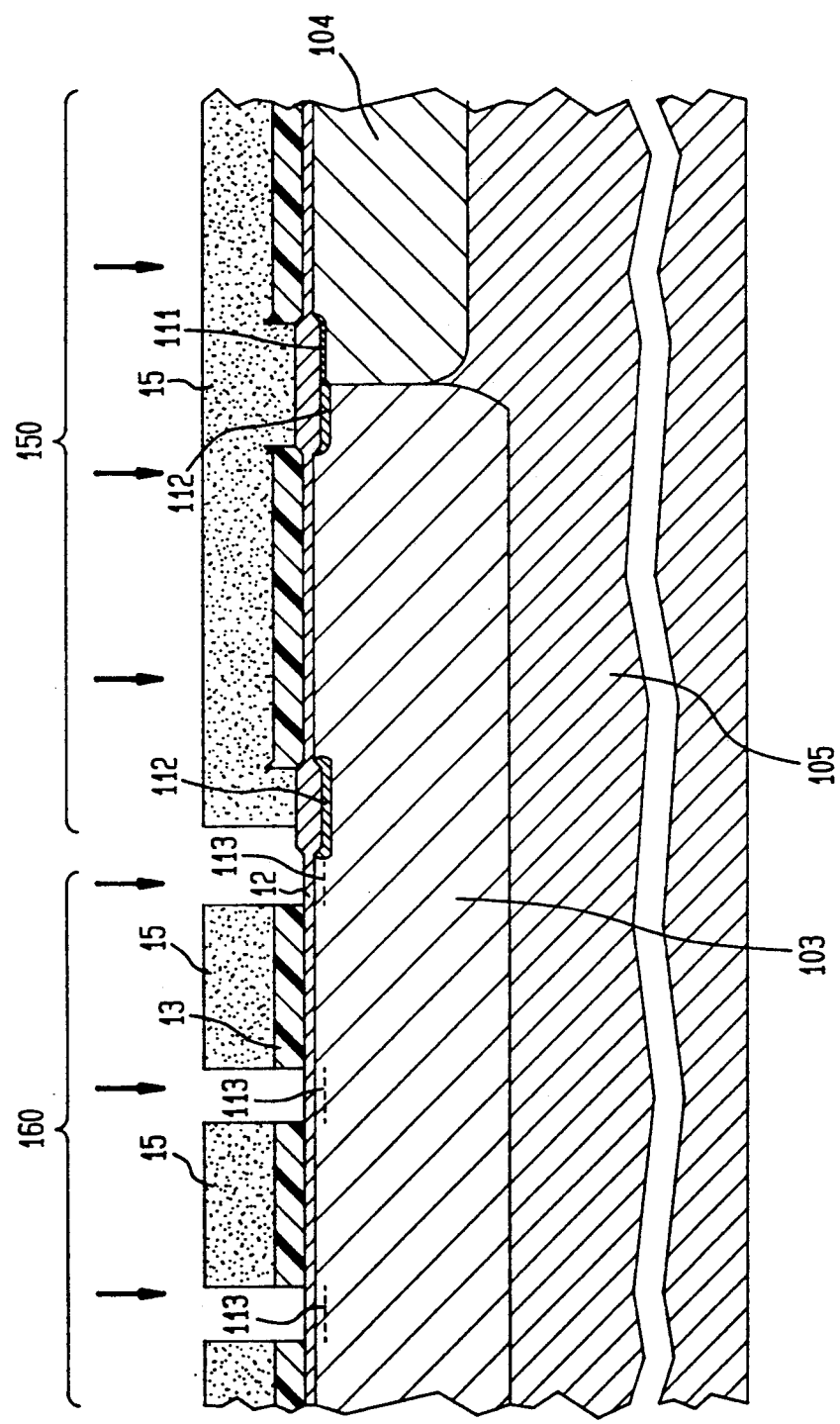
Figure 2E:
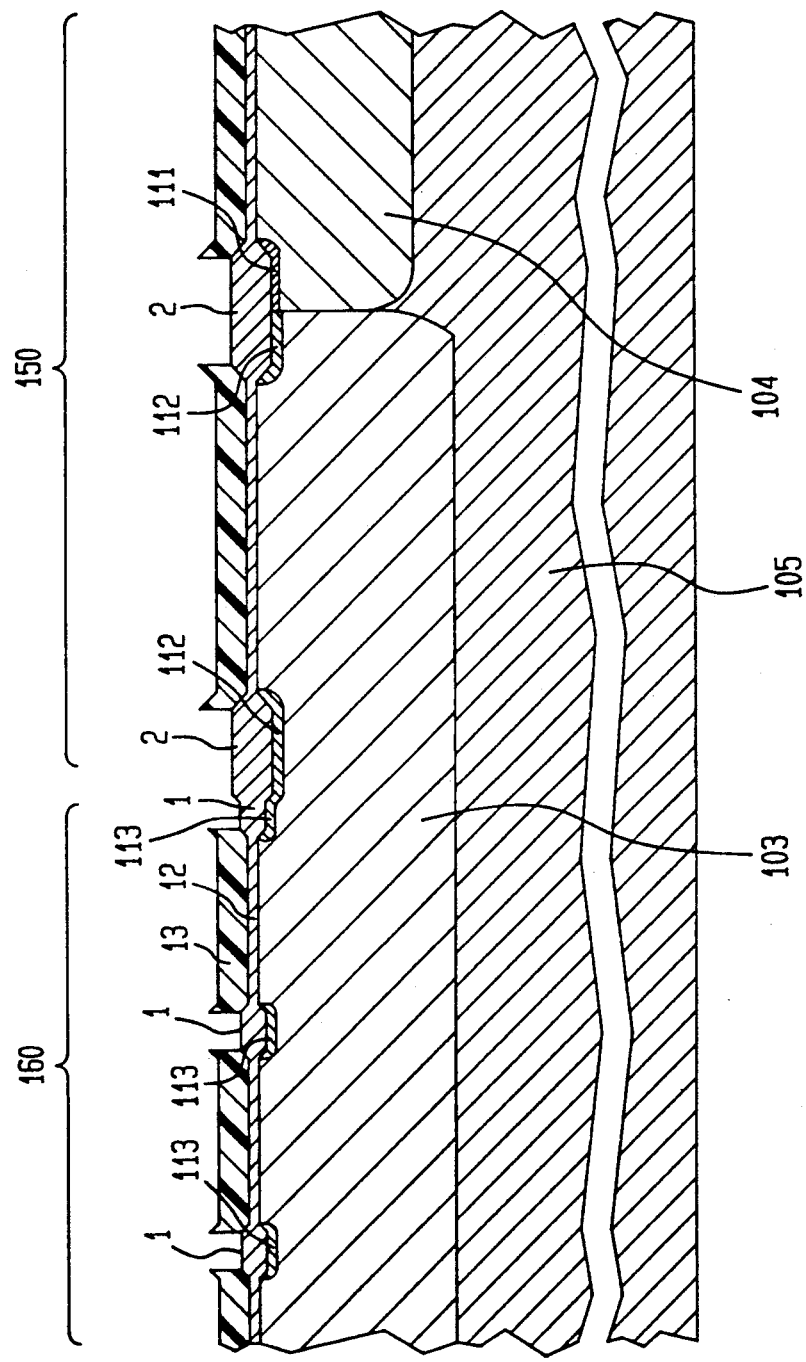
Figure 2H:
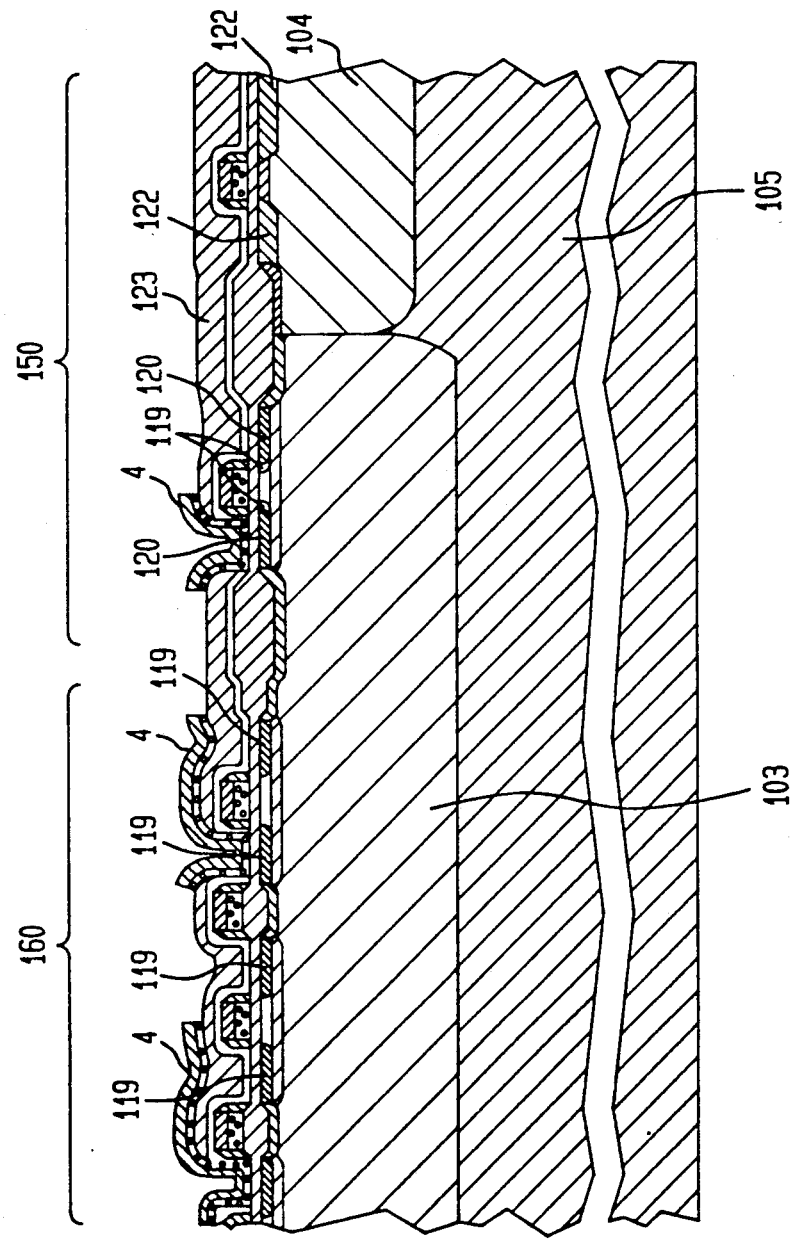

Before the resist 15 was removed, boron ions were implanted in the silicon substrate 105 to form channel stops 113 in the isolation regions of the memory cell section (see FIG. 2D). Implantation was performed at an acceleration energy of 50 keV and a dose of $2.0 \times 10^{13}$ ions/cm$^2$.

The boron ions implanted in the isolation regions of the peripheral circuit section were subjected to heat treatment for a longer period than those implanted in the isolation regions of the memory cell section, so that the n-channel stops 113 of the memory cell section have a higher concentration than that of the n-channel stops 112 in the peripheral circuit section.

After the resist 15 was removed, the surface of the regions not covered with the Si$_3$N$_4$ film 13 in the silicon substrate 105 was selectively oxidized (second LOCOS process). By means of this oxidation process, the oxide film formed by the first LOCOS process was grown to become a thick LOCOS insulating film 2, and a thin LOCOS insulating film 1 was formed in the second region 160 of the silicon substrate 105 (see FIG. 2E).

The thickness of the thick LOCOS insulating film 2 is dependent on both the first LOCOS process and the second LOCOS process, so that by adjusting the oxidation conditions of both processes, a LOCOS insulating film can ultimately be obtained with the desired thickness. In this embodiment, the thick LOCOS insulating film 2 was 500 nm, and the thin LOCOS insulating film 1 was 300 nm, so that the initial thickness of the oxide film grown in the first LOCOS process was 400 nm. The initial thickness of the thin LOCOS insulating film 1 grown in the second LOCOS process was 400 nm. The oxide film grown in the first LOCOS process was grown so as to have a thickness of from 400 nm to 650 nm in the second LOCOS process. Since the surfaces of the thick LOCOS insulating film 2 and the thin LOCOS insulting film 1 were etched to a certain degree in later etching steps, etc., the final thicknesses of the thick LOCOS insulating film 2 and the thin LOCOS insulting film 1 became 500 nm and 300 nm, respectively.

By means of the above method, the LOCOS insulating films 1 and 2 with mutually different thicknesses were formed on the same silicon substrate 105.

After the Si$_3$N$_4$ film 13 was removed, boron ions were selectively implanted at an acceleration energy of 160 keV and a dose of $4.0 \times 10^{12}$ ions/cm$^2$ in the region of the silicon substrate 105 where the n-type MOSFET 101 was to be formed in order to suppress the narrow channel effect on the n-type MOSFET 101. 114. The threshold voltage of the n-type MOSFET 101 is optimized by the p-well concentration, so that ion implantation for particular threshold voltage adjustment was not performed.

After the resist was removed, BF$_2$+ ions were selectively implanted at an acceleration energy of 50 keV and a dose of $4.0 \times 10^{12}$ ions/cm$^2$ in the region of the silicon substrate 105 where the p-type MOSFET 102 was to be formed in order to adjust the threshold voltage of the p-type MOSFET 102.

After the gate oxide film 116 (16 nm thick) was formed on the surface of the active regions, a polysilicon film 117 (200 nm thick) was grown on top of the gate oxide film 116 and the LOCOS insulating films 1 and 2 to become the word lines. After phosphorus ions were diffused in the polysilicon film 117 to give it conductivity, a CVD oxide film 118 (200 nm thick) was grown on top of the polysilicon film 117 (see FIG. 2F).

The CVD oxide film 118 and the polysilicon film 117 were patterned in the shape of the wiring pattern of the word lines 3 using a conventional photolithography, whereby the word lines 3 were formed. Thereafter, phosphorus ions were implanted at an acceleration energy of 40 keV and a dose of $2.0 \times 10^{13}$ ions/cm$^2$ in the region of the silicon substrate 105 where the n-type MOSFET 101, 106 were to be formed.

After the CVD oxide film (200 nm thick) was grown on top of the silicon substrate 105, most of the CVD oxide film was removed by reactive ion etching (RIE), which is one of the anisotropic etching techniques, and the CVD oxide film remaining on the sides of the word lines 3 became the side walls 121.

Arsenic ions were implanted at an acceleration energy of 40 keV and a dose of $6.0 \times 10^{15}$ ions/cm$^2$ in the active region where the n-type MOSFET 101 of the peripheral circuit was to be formed, and $BF_2^+$ ions were implanted at an acceleration energy of 40 keV and a dose of $4.0 \times 10^{15}$ ions/cm$^2$ in the active region where the p-type MOSFET 102 was to be formed. In this manner, the source/drain 122 and 120 of the MOSFETs 101 and 102 were formed in the silicon substrate 105 (see FIG. 2G).

In order to prevent shortening of the charge hold time due to junction leak, etc., high dose ion implantation for source/drain formation was not performed in the active region where the MOSFET 106 in the memory cell section was to be formed.

The CVD oxide film (50 nm thick) and borophosphosilicate glass (BPSG) film (400 nm thick) were successively grown on the silicon substrate 105 to form the interlayer insulating film 123 consisting of these two films. The silicon substrate 105 was then subjected to heat treatment for 30 minutes at 900° C. to perform reflow of the BPSG film. As a result of the reflow, the interlayer insulating film 123 became flat.

Next, after contact holes were formed in the insulating film 123 for connection of the n-type MOSFET 106, which is a switching transistor, and the bit lines 4 to be formed in a later step, a polysilicon film (90 nm thick) for forming the bit lines 4 and a tungsten silicide film ($WSi_{2.7}$, film thickness: 200 nm) were successively grown on the insulating film. The composite-layered film (i.e., polycide film) consisting of the polysilicon film and the tungsten silicide film was patterned in the shape of the bit lines 4, and the bit lines 4 were formed (see FIG. 2H). In order to reduce the wiring resistance of the bit lines 4, arsenic ions were implanted in the polysilicon film at an acceleration energy of 80 keV and a dose of $1.0 \times 10^{15}$ ions/cm$^2$ before the tungsten silicide film was grown.

A CVD oxide film (50 nm thick) and BPSG film (400 nm thick) were successively grown on the silicon substrate 105 to form the interlayer insulating film 124 consisting of these two films. Reflow of the BPSG film was performed by heat treatment of the silicon substrate 105 for 30 minutes at 900° C. As a result of reflow, the interlayer insulating film 124 became flat.

Before forming the capacitor 5 on the interlayer insulating film 124, a contact hole for connecting the n-type MOS 106 and the storage node 7 was formed in the interlayer insulating film 124.

After forming a conductive polysilicon layer (500 nm thick) on the interlayer insulating film 124, the conductive polysilicon layer was patterned and the storage node 7 formed.

Figure 2I:
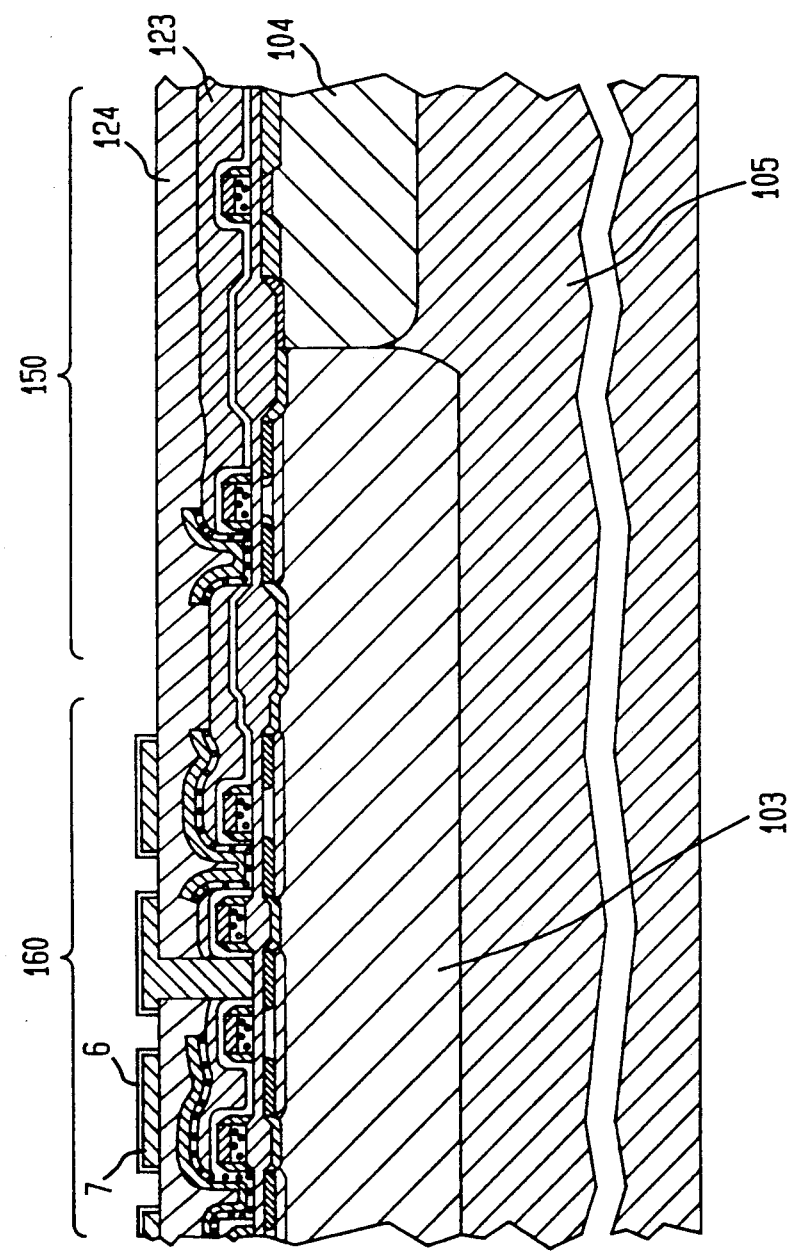

An oxide-nitride-oxide (ONO) film with a thickness of 7 to 8 nm in terms of the thickness of oxide films was formed on top of the storage node 7 as the capacitor oxide film 6 (see FIG. 2I).

After a conductive polysilicon film (200 nm thick) was grown on the silicon substrate 105 to cover the capacitor oxide film 6, the conductive polysilicon film was patterned to form the plate electrode 8.

After an interlayer insulating film 125 was grown on the silicon substrate 105 and contact holes were formed in the interlayer insulating films 123, 124 and 125, the metal wirings 9 and 10 were formed on the interlayer insulating film 125.

The DRAM shown in FIG. 1A was produced by the production method described above.

In this embodiment, a concentration difference was made between the n-channel stop 112 of the peripheral circuit section and the n-channel stop 113 in the memory cell section formed in the same p-well 103, but there can also be a concentration difference made between the p-well where the peripheral circuit is formed and the p-well where the memory cell section is formed. More specifically, the impurity concentration below the thin LOCOS insulting film 1 can be made higher than the impurity concentration below the thick LOCOS insulating film 2.

Figure 5:
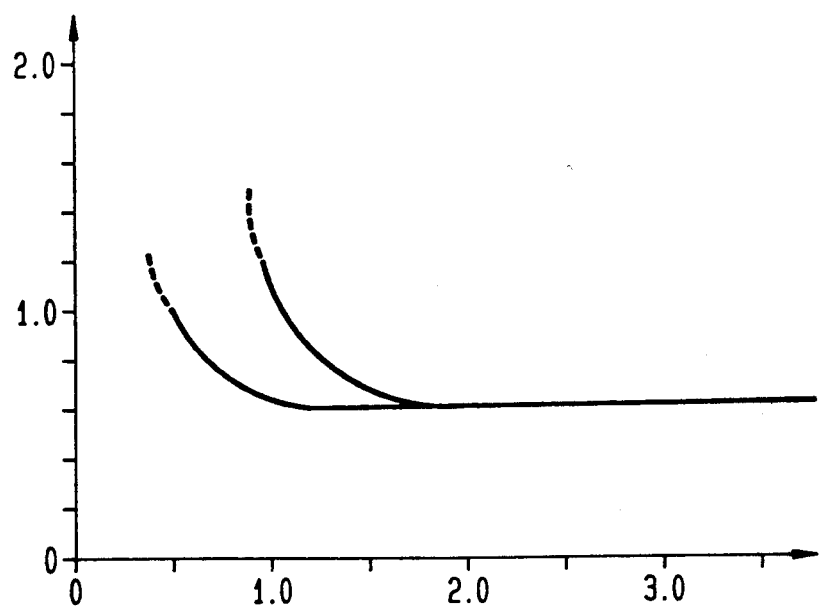
FIG. 5 is a graph showing the transistor characteristics (the dependence of threshold voltage on channel width) with respect to MOSFETs separated by a thick LOCOS insulating film and MOSFETs separated by a thin LOCOS insulating film.
Figure 7A:
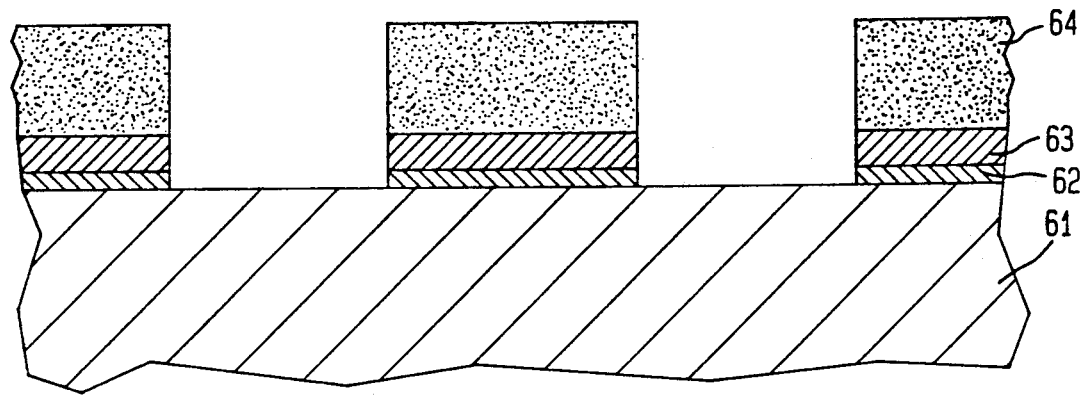
FIGS. 7A and 7B are sectional views showing the production of a conventional semiconductor device.
Figure 7B:
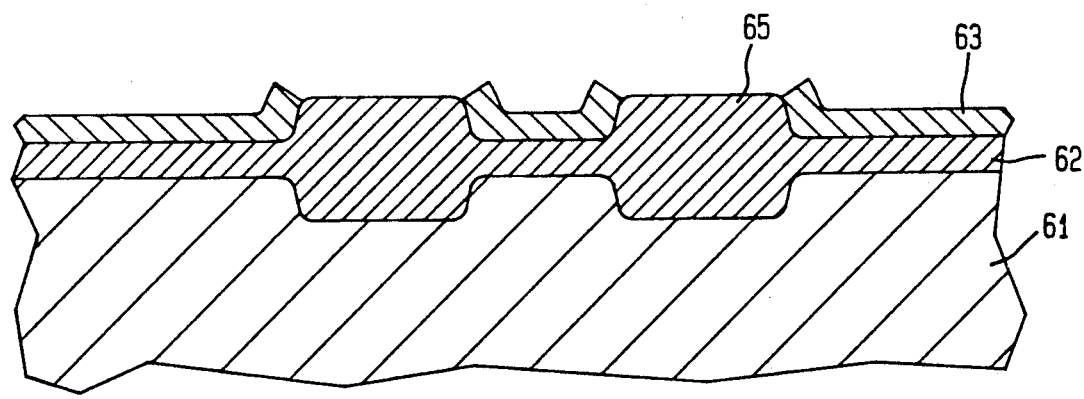

FIG. 5 is a graph showing one of the transistor characteristics (dependence of threshold voltage on channel width) of the MOSFET isolated by the thick LOCOS insulating film (500 nm thick) and of the MOSFET isolated by the thin LOCOS insulating film (300 nm thick). As shown in FIG. 5, the transistor characteristics of the MOSFET separated by the thin LOCOS insulating film exhibited no narrow channel effect down to a channel width (design value) of below approximately 1.0 μm. This was because any large reduction in the effective width of the active region was prevented by suppression of the penetration of bird's beak.

Figure 6:
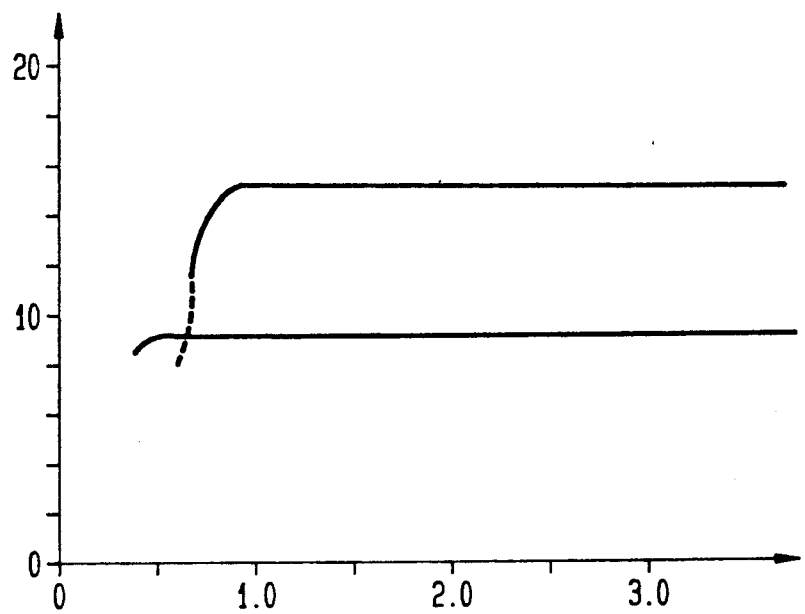
FIG. 6 is a graph showing the element separation characteristics (the dependence of element isolation withstand voltage on separation region width) with respect to thick LOCOS insulating films and thin LOCOS insulating films.

FIG. 6 is a graph showing the element isolation characteristics (dependence of element isolation withstand voltage on isolation region width) of the thick LOCOS insulating film (500 nm thick) and the thin LOCOS insulating film (300 nm thick).

As shown in FIG. 6, the element isolation withstand voltage of the thick LOCOS insulating film is 1.5 times greater than that of the thin LOCOS insulating film.

As can be seen from FIGS. 5 and 6, in the prior art, when the LOCOS insulating film was made thin (e.g., 300 nm thick) to prevent the narrow channel effect on the MOSFET 106 in the memory cell section, the element isolation characteristics in the peripheral circuit section became degraded, and when the LOCOS insulating film was made thick (e.g., 500 nm thick) to improve the element isolation characteristics, the narrow channel effect would occur in the memory cell section.

However, according to this invention, semiconductor devices with a high performance are provided which solve the above problems.

Micrographs showing the cross-sectional structure of the DRAM of FIG. 1 are shown in FIGS. 8A through 11 for reference.

Figure 8A:
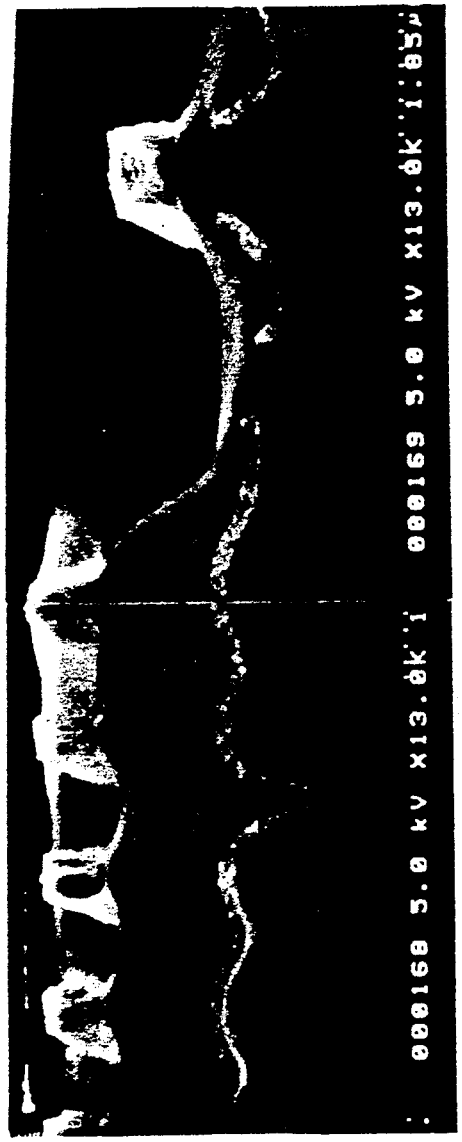
FIGS. 8A and 8B are scanning electron micrographs (SEMs) showing the cross section of the semiconductor device of FIG. 1A.
Figure 8B:
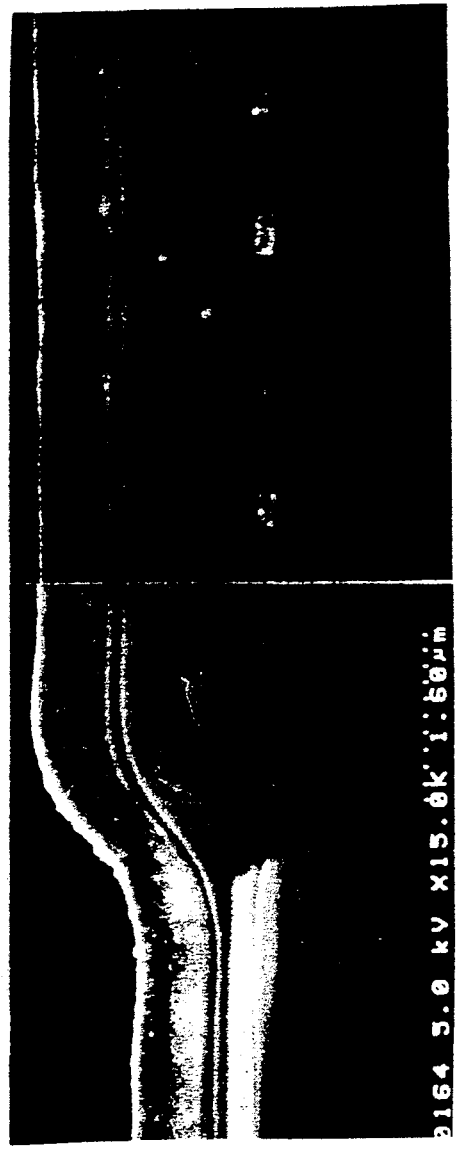

FIGS. 8A and 8B are scanning electron micrographs (SEM) showing the cross section of the first embodiment. It can be seen that the LOCOS insulating film in the peripheral circuit section is thicker than that in the memory cell section.

Figure 9:
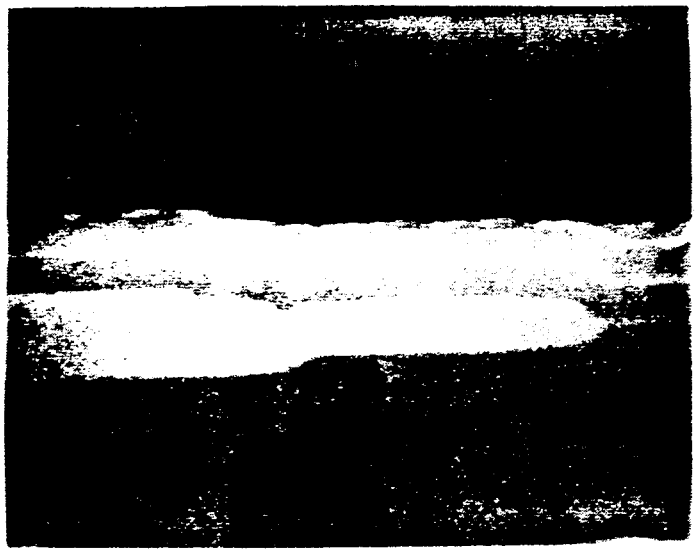
FIG. 9 is an electron micrograph showing the cross section of the LOCOS insulating film at the boundary between the first region and the second region of the silicon substrate in the semiconductor device of FIG. 1A.

FIG. 9 is an electron micrograph showing the cross section of the LOCOS insulating film at the boundary between the first region 150 and the second region 160 of the silicon substrate of the first embodiment. There are differences in level on the top and bottom surfaces of the LOCOS insulating film at the boundary.

Figure 10B:
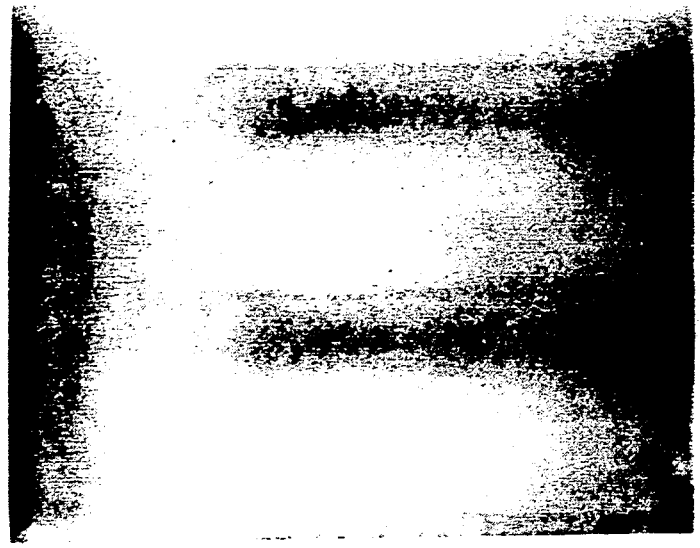
FIGS. 10A and 10B are electron micrographs showing the active region surrounded by a thick LOCOS insulating film.
Figure 10A:
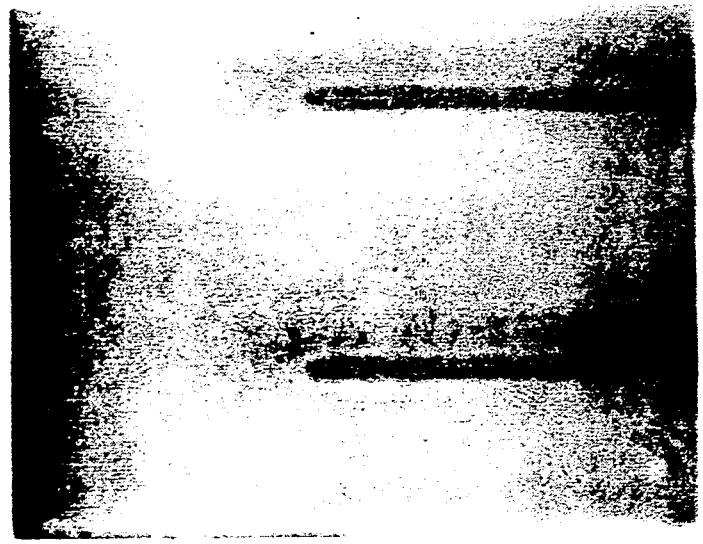

FIG. 10A is a plane view showing the active region 1.2 μm wide (isolation region width: 1.2 μm surrounded by the thick LOCOS insulating film (500 nm thick). The active region is almost entirely covered by bird's beak, and only part of the silicon substrate surface is exposed.

FIG. 10B is a plane view showing the active region 1.0 μm wide (isolation region width: 1.0 μm) surrounded by the thick LOCOS insulating film (500 nm thick). The active region is entirely covered by bird's beak.

FIG. 11 is a plan view showing the active region 0.5 μm wide (isolation region width: 0.4 μm) surrounded by the thin LOCOS insulating film (300 nm thick). Even though the active region is extremely narrow, penetration of bird's beak is suppressed to 0.1 μm and the silicon substrate surface is exposed.

The first embodiment shown in FIG. 1 was DRAM, but this invention can also be applied to semiconductor devices other than DRAM.

Below is an explanation of the second embodiment of this invention, referring to FIGS. 3A through 3D.

Figure 3A:
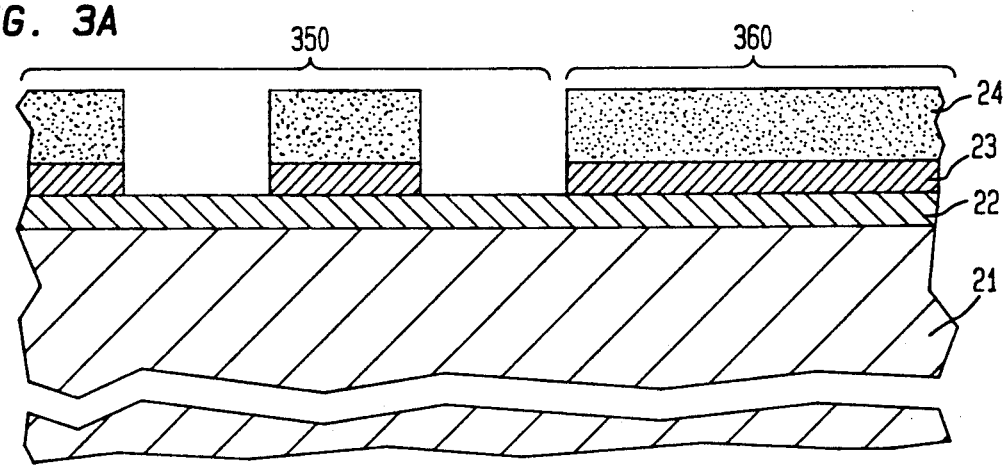
FIGS. 3A to 3D are sectional views showing the production of the second embodiment of the semiconductor device of this invention.

First, on the silicon substrate 21, the oxide film 22 (20 nm thick) as a protective film and the CVD-$Si_3N_4$ film 23 (160 nm thick) as the first mask layer were successively grown, and then a resist 24 with an opening was formed above the region where the thick LOCOS insulating film 25 was to be formed in the silicon substrate 21 and the CVD-$Si_3N_4$ film 23 at the opening was removed by anisotropic etching (see FIG. 3A).

As in the first embodiment, the thick LOCOS insulating film 25 was formed in the first region 350 of the silicon substrate 21 where the active region was relatively wide. The thin LOCOS insulating film 28, however, was formed in the second region 360 of the silicon substrate 21 where the active region was narrow than the active region in the first region 350.

Figure 3B:
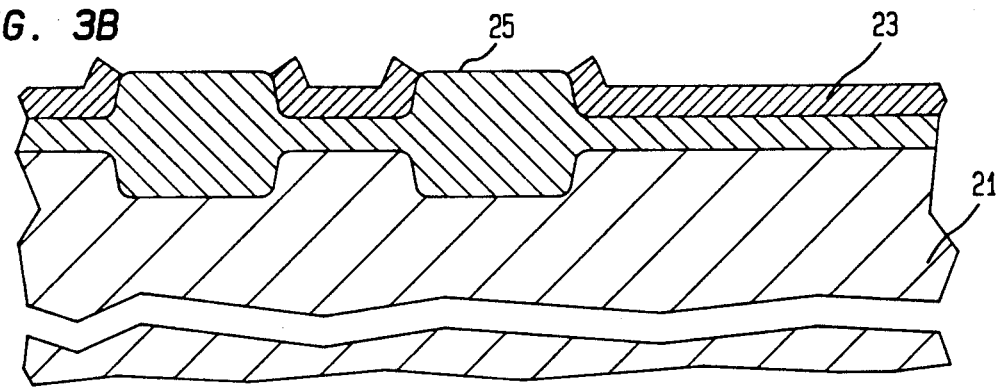

After the resist 24 was removed, the silicon substrate 23 in the region where the CVD-Si3N4 film was removed was oxidized by the first LOCOS process (see FIG. 3B). The thick LOCOS insulating film 25 (650 nm thick) was formed in this manner. Thereafter, the CVD-$Si_3N_4$ film 23 was completely removed.

Figure 3C:
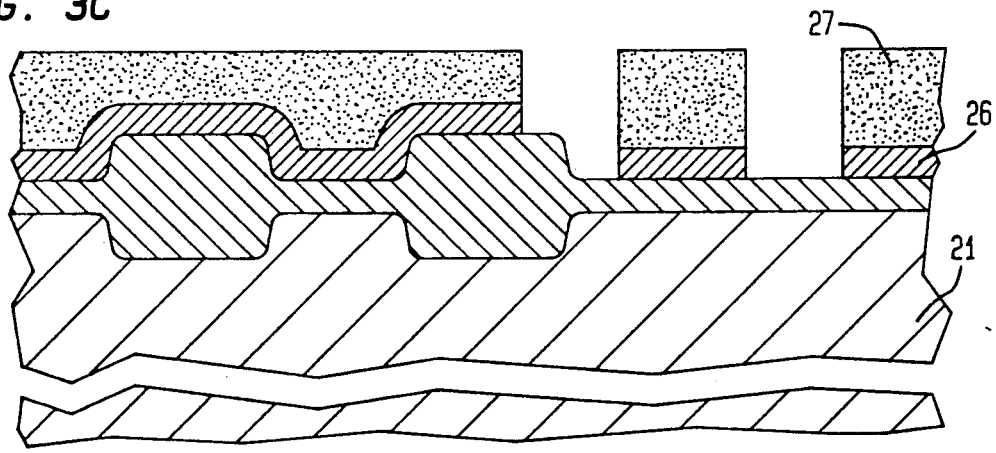
Figure 3D:
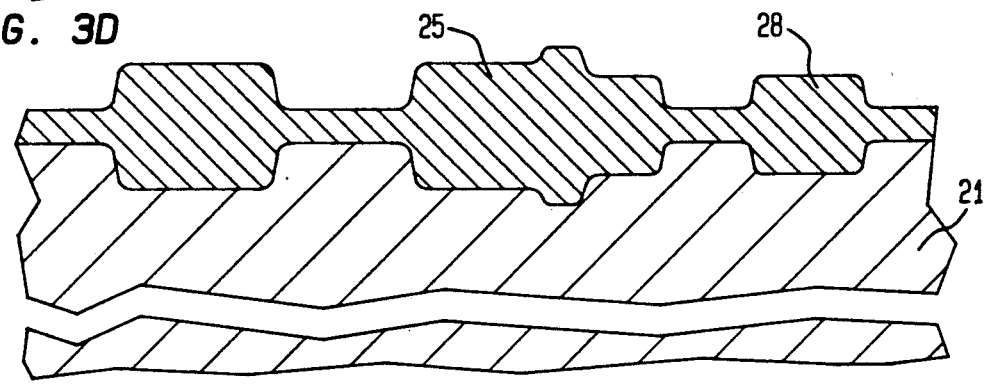

After the CVD-$Si_3N_4$ film 26 (160 nm thick) was grown on the silicon substrate 21 as the second mask layer, resist 27 was formed on the silicon substrate 21 with an opening over the region of where the LOCOS insulating film 28 was to be formed, and CVD1 $Si_3N_4$ film 26 at the opening was removed by anisotropic etching (see FIG. 3C). The second CVD-$Si_3N_4$ film 26 patterned in this manner was patterned in such as way as to cover the thick LOCOS insulating film in the first region 350 and the active region in the second region 360 of the silicon substrate 21.

After the resist 27 was removed, the silicon substrate 23 in the region where the CVD-$Si_3N_4$ film 26 was removed (isolation region in the second region 360) was oxidized by the second LOCOS process. The thin LOCOS insulating film 28 (400 nm thick) was formed in this manner. Next, the CVD-$Si_3N_4$ film 26 was removed (see FIG. 3D).

The surfaces of the LOCOS insulating films 25 and 28 were etched to some degree by the following processes, so that ultimately the thick LOCOS insulating film 25 became 500 nm thick and the thin LOCOS insulating film 28 became 300 nm thick.

In this manner, the thick LOCOS insulating film 25 and the thin LOCOS insulating film 28 were readily formed on the same silicon substrate 21 by the production method of this embodiment.

In both of the embodiments described above, the pattern which defined the area where the thick LOCOS insulating film was to be formed and the pattern which defined the area where the thin LOCOS insulating film was to be formed were transferred to the resist on the silicon substrate by using two different types of photomasks corresponding to the respective patterns.

Therefore, there is the possibility that the position of these two types of patterns will shift with respect to each other, and this shift is dependent on the level-to-level alignment accuracy. If the active region patterns shift with each other in the first and second regions of the silicon substrate, the following problems arise.

As an example, the wiring pattern is transferred to the resist on the silicon substrate, so that the alignment of the wiring pattern could be performed in relation to a pattern (element isolation pattern) consisting of the isolation region and active regions of the silicon substrate.

If the pattern for the thick LOCOS insulating film in the second region and the pattern for the thin LOCOS insulating film in the first region are shifted with each other, when alignment is performed using the alignment mark in the first region as a reference, the position of the elements and the position of the wirings in the second region would be shifted even though the positions of the elements and the positions of the wirings conformed in the first region, so that those elements and wirings could not be correctly interconnected.

On the other hand, when the alignment mark in the second region was used as a reference for alignment, the position of the elements and the position of the wirings in the first region would be shifted even though the position of the elements and the position of the wirings conformed in the second region, so that those elements and wirings could not be correctly interconnected.

Below is a description of the third embodiment, referring to FIGS. 4A through 4F, in which the above-discussed problem does not occur.

First, the oxide film 52 (20 nm thick) as a protective film and the CVD-$Si_3N_4$ film 53 (160 nm thick) as the first mask layer were successively grown on the silicon substrate 51. Next, the oxide film 54 (100 nm thick) was formed on the CVD-$Si_3n_4$ film 53 by sputtering.

Figure 4A:
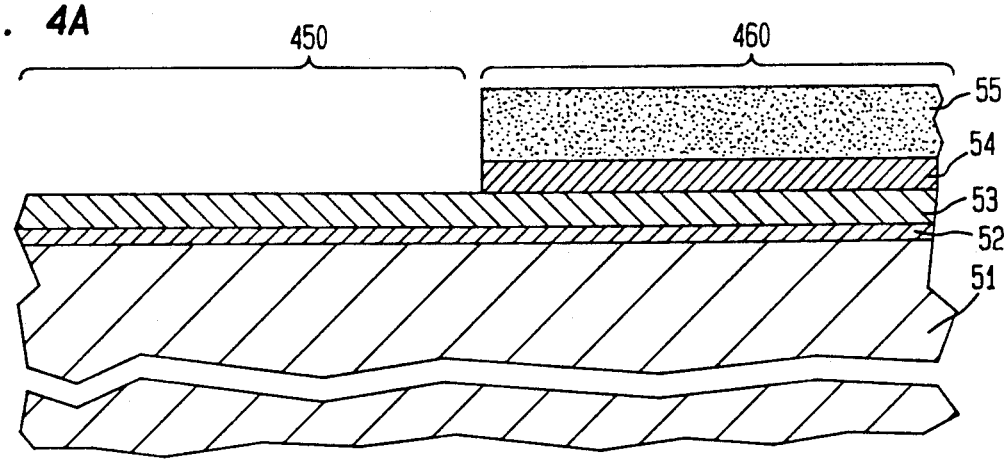
FIGS. 4A to 4F are sectional views showing the production of the third embodiment of the semiconductor device of this invention.

After the resist 55 was formed over the region of the silicon substrate 51 where the thin LOCOS insulating film 59 was to be formed, those parts of the oxide film 54 not covered with the resist 55 were removed (see FIG. 4A). Here, the resist 55 remained on the second region 460 of the silicon substrate 51.

Figure 4B:
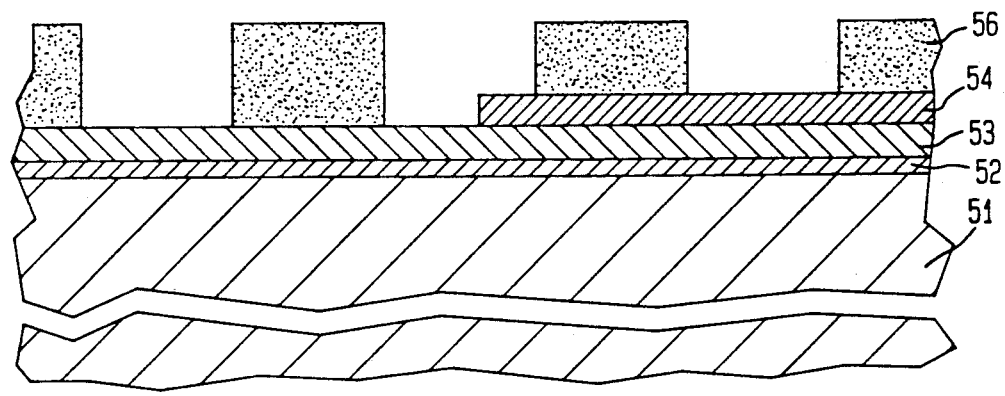

After the resist 55 was removed, the resist 56 patterned to define the element isolation pattern was formed on the CVD-$Si_3N_4$ film 53 and the oxide film 54 (see FIG. 4B). The resist 56 was formed on the active region of the silicon substrate 51 and was not present on the isolation region. The resist 56 had a pattern that simultaneously defined both the element isolation region of the first region 450 and the element isolation region of the second region 460 of the silicon substrate 51.

That part of the CVD-$Si_3N_4$ film 53 not covered with the resist 56 was completely removed in an etching step which used the resist 56 as an etching mask.

Figure 4C:
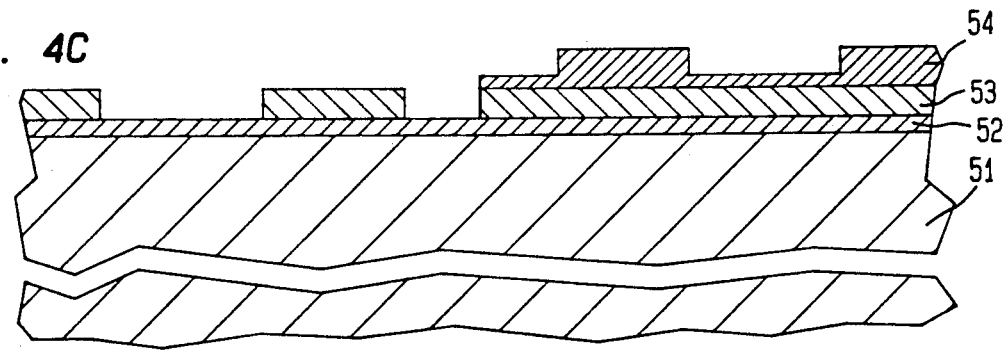
Figure 4D:
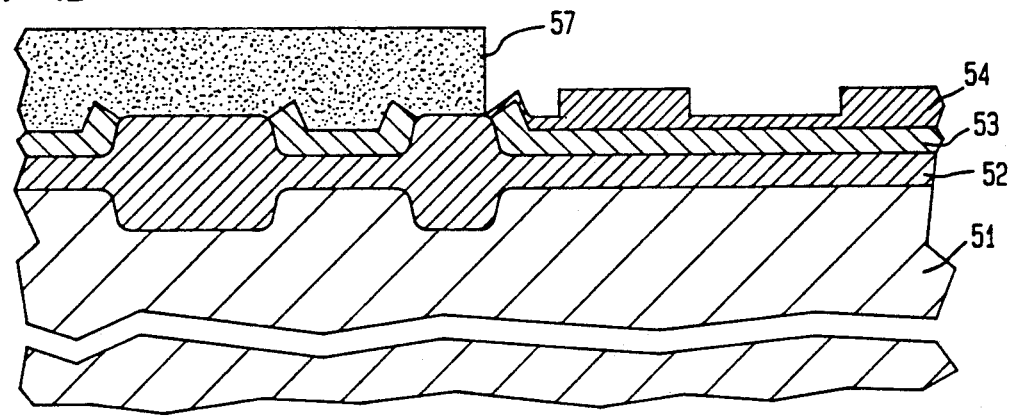
Figure 4E:
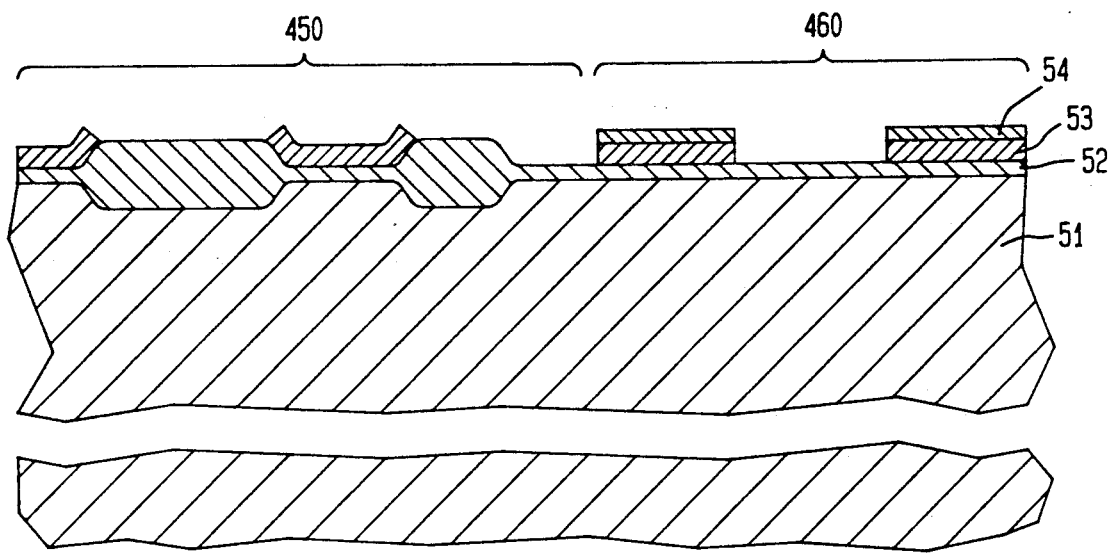

At the same time, the top of the oxide film 54 not covered with the resist 56 was etched to a certain extent (see FIG. 4C).

More specifically, etching to a thickness of 190 nm was performed on the CVD-$Si_3N_4$ film 53 with a thickness of 160 nm, thus allowing a 30 nm margin to make sure that all of the CVD-Si₃N₄ film 53 not covered with the resist 56 in the first region 450 was completely removed. This formed a difference in level of approximately 40 nm on the top surface of the oxide film 54 of the second region 460.

The element isolation patterns for both the CVD-Si₃N₄ film 53 on the first region 450 and the oxide film 54 on the second region 460 were transferred simultaneously in this manner.

After the resist 56 was removed, an oxide film was formed in the first region 450 of the silicon substrate 51 by the first LOCOS process. This oxide film was grown in the later second LOCOS process to become the thick LOCOS insulating film 58.

Next, resist 57 was formed only in the first region 450 of the silicon substrate 51, and then the oxide film 54 on the second region 460 was etched from that surface. Upon completion of this etching process, that part (thin part) of the oxide film 54 on the isolation region was removed, and the CVD-Si₃N₄ film 53 on the isolation region was also completely removed (see FIG. 4E). The isolation region surface of the second region 460 of the silicon substrate 51 was exposed in this manner. That part (thick part) of the oxide film 54 on the element isolation region was not removed completely and the element isolation pattern defined by the oxide film 54 was transferred to the CVD-Si₃N₄ film 53.

Figure 4F:
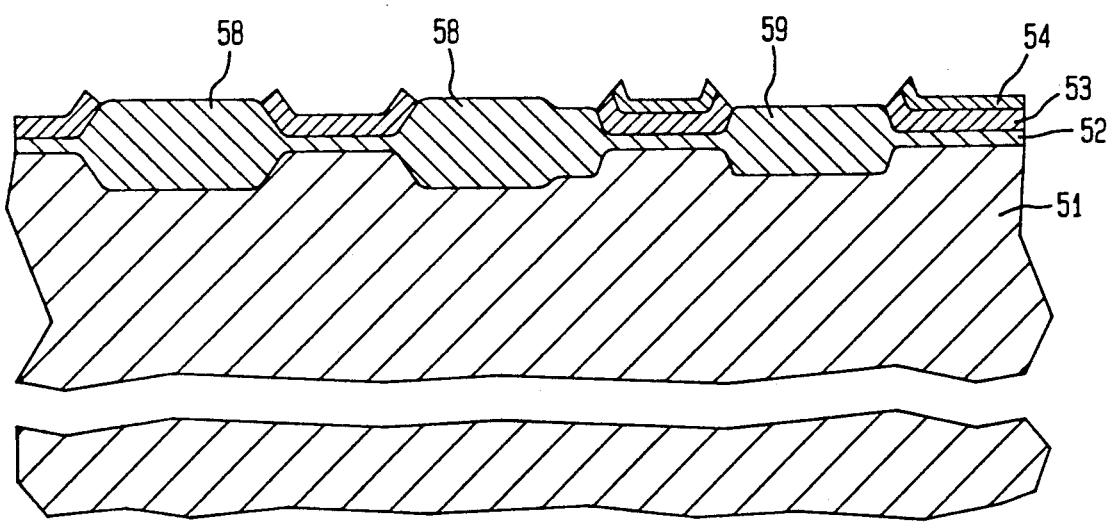

Next, the thin LOCOS insulating film 59 was grown in the isolation region of the second region 460 of the silicon substrate 51 by the second LOCOS process (see FIG. 4F).

At this time, the oxide film of the first region 450 grown by the first LOCOS process was grown to a thick LOCOS insulating film 58.

In this embodiment, the LOCOS process was performed under the same oxidation conditions as in the second embodiment.

According to the production method of this embodiment, the position of the thick LOCOS insulating film 58 and the thin LOCOS insulating film 59 did not shift.

The oxide film 54 of this embodiment was formed by sputtering, but films formed by other methods can also be used. The oxide films can be those with a smaller etching rate than that the CVD-Si₃N₄ film 53, the shape of which is not changed by the first LOCOS process. Therefore, conventional CVD oxide films may also be used as these films.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for producing a semiconductor device in which a plurality of active regions formed on a semiconductor substrate having a surface divided into a first and second regions are electrically isolated from each other by a local-oxidized (LOCOS) insulating film formed on said substrate, comprising the steps of:

forming a masking film on said substrate;

growing an oxide film on said masking film;

removing the portion of said oxide film positioned above said first regions;

forming a resist having openings on the areas where said active regions are to be formed in said substrate, on said oxide film and masking film;

patterning said oxide film and masking film by the use of said resist as a mask, so that said masking film has openings on the areas where said LOCOS insulating film is to be formed in said first region of the substrate, resulting in a thin portion of said oxide film where said LOCOS insulating film is to be formed in said second region of the substrate;

forming an oxide film, after removing said resist, on the surface of said substrate in the openings where the substrate is exposed;

removing a thin portion of said oxide film and further removing a portion of said masking film below said thin portion of the oxide film, and then forming openings in said masking film; and forming a relatively thin portion of said LOCOS insulating film by an oxidation process, in the second region of said substrate in said openings where the substrate is exposed, and simultaneously further growing said oxide film in the first region to form a relatively thick portion of said LOCOS insulating film.

* * * * *